US010930690B2

(12) United States Patent
Kobayashi et al.

(10) Patent No.: US 10,930,690 B2
(45) Date of Patent: Feb. 23, 2021

(54) PHOTOELECTRIC CONVERSION APPARATUS, PHOTOELECTRIC CONVERSION SYSTEM, AND MOVABLE BODY

(71) Applicant: CANON KABUSHIKI KAISHA, Tokyo (JP)

(72) Inventors: Masahiro Kobayashi, Tokyo (JP); Hiroshi Sekine, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/711,167

(22) Filed: Dec. 11, 2019

(65) Prior Publication Data

US 2020/0194482 A1    Jun. 18, 2020

(30) Foreign Application Priority Data

Dec. 17, 2018 (JP) .............................. JP2018-235921

(51) Int. Cl.
*H01L 27/146* (2006.01)
*H04N 5/359* (2011.01)
(Continued)

(52) U.S. Cl.
CPC .. *H01L 27/14623* (2013.01); *H01L 27/14603* (2013.01); *H01L 27/14612* (2013.01);
(Continued)

(58) Field of Classification Search
CPC ...... H04N 5/357; H04N 5/3591; H04N 5/359; H04N 5/378; H04N 5/374; H04N 5/37452;
(Continued)

(56) References Cited

U.S. PATENT DOCUMENTS 10,777,594 B2 * 9/2020 Arakawa ................ H04N 5/359
2011/0234836 A1 * 9/2011 Machida .............. H04N 5/3595
348/222.1
(Continued)

FOREIGN PATENT DOCUMENTS

JP            10-74924 A      3/1998
JP       2003-234496 A      8/2003
(Continued)

*Primary Examiner* — Albert H Cutler
(74) *Attorney, Agent, or Firm* — Canon U.S.A., Inc. IP Division

(57) ABSTRACT

A photoelectric conversion apparatus includes a plurality of pixels each including a photoelectric conversion portion, a charge holding portion, a floating diffusion, and first and second transistors disposed in a common active region. The active region includes a partial region which includes a first region extending in a first direction, a second region connected to the first region and extending in a second direction, and a third region connected to the second region and extending in a third direction. In a planar view, the partial region of a first pixel is disposed between a gate of the first transistor of the first pixel and the charge holding portion of a second pixel, and between a gate of the second transistor of the first pixel and the charge holding portion of the second pixel. A light-shielding member is disposed in a region overlapping the partial region.

20 Claims, 14 Drawing Sheets

(51) Int. Cl.
  *H04N 5/378* (2011.01)
  *H04N 5/374* (2011.01)
  *G01S 7/4914* (2020.01)
  *G01S 7/4863* (2020.01)
  *G01S 17/894* (2020.01)
  *H01L 27/144* (2006.01)

(52) U.S. Cl.
  CPC ............. *H04N 5/359* (2013.01); *H04N 5/374* (2013.01); *H04N 5/378* (2013.01)

(58) Field of Classification Search
  CPC ......... H01L 27/14623; H01L 27/14612; H01L 27/14603; H01L 27/1461; H01L 27/1463; H01L 27/144; G01S 7/4914; G01S 7/4863; G01S 17/894
  See application file for complete search history.

(56) References Cited

U.S. PATENT DOCUMENTS

| | | | | |
|---|---|---|---|---|
| 2011/0248371 A1* | 10/2011 | Matsumura | ....... | H01L 27/14614 257/443 |
| 2014/0015013 A1* | 1/2014 | Arakawa | .......... | H01L 27/14614 257/231 |
| 2015/0069471 A1* | 3/2015 | Kawamura | ....... | H01L 27/14683 257/228 |
| 2015/0256769 A1* | 9/2015 | Kim | .................. | H01L 27/14645 348/302 |
| 2015/0264283 A1* | 9/2015 | Kobayashi | ......... | H04N 5/37452 257/229 |
| 2015/0372038 A1* | 12/2015 | Lee | .................. | H01L 27/14612 348/294 |
| 2017/0005121 A1* | 1/2017 | Lenchenkov | .......... | H04N 5/353 |
| 2017/0207257 A1* | 7/2017 | Nishihara | ......... | H01L 27/14623 |
| 2017/0323912 A1* | 11/2017 | Lahav | ............... | H01L 27/14623 |
| 2018/0033809 A1 | 2/2018 | Tayanaka | | |
| 2018/0211987 A1* | 7/2018 | Okuno | ............... | H04N 9/04557 |
| 2020/0204753 A1* | 6/2020 | Sugizaki | ............. | H01L 27/1464 |
| 2020/0266221 A1* | 8/2020 | Uchida | ................. | H01L 27/088 |
| 2020/0295068 A1* | 9/2020 | Sato | ..................... | H01L 27/146 |

FOREIGN PATENT DOCUMENTS

| | | |
|---|---|---|
| JP | 2009-272374 A | 11/2009 |
| JP | 2010-098113 A | 4/2010 |
| JP | 2010-135509 A | 6/2010 |
| JP | 2011-216970 A | 10/2011 |
| JP | 2016-511539 A | 4/2016 |
| JP | 2016-115855 A | 6/2016 |
| JP | 2018-092976 A | 6/2018 |
| JP | 2018-157127 A | 10/2018 |
| WO | 2016/098624 A1 | 6/2016 |
| WO | 2016/136486 A1 | 9/2016 |

\* cited by examiner

PHOTOELECTRIC CONVERSION APPARATUS, PHOTOELECTRIC CONVERSION SYSTEM, AND MOVABLE BODY

BACKGROUND

Field

The present disclosure relates to a photoelectric conversion apparatus, a photoelectric conversion system including the photoelectric conversion apparatus, and a movable body including the photoelectric conversion apparatus.

Description of the Related Art

Known photoelectric conversion apparatuses include pixels each including a photoelectric conversion portion, a charge holding portion configured to hold a charge generated in the photoelectric conversion portion, and a floating diffusion to which the charge is transferred from the charge holding portion. Japanese Patent Application Laid-Open No. 2009-272374 discusses a technique in which a signal charge accumulated by the photoelectric conversion portion included in each pixel on which light is incident is transferred to the charge holding portion. In the technique discussed in Japanese Patent Application Laid-Open No. 2009-272374, the transfer of the signal charge from the charge holding portion to the floating diffusion is performed row by row. If light is incident on the charge holding portion in a state where the charge holding portion is holding the signal charge, aliasing of signals occurs, which leads to a deterioration in image quality. As discussed in Japanese Patent Application Laid-Open No. 2009-272374, in order to prevent light from being incident on the charge holding portion, the charge holding portion is shielded from light by a light-shielding member mainly made of metal.

In a case where a light-shielding member is provided as discussed in Japanese Patent Application Laid-Open No. 2009-272374, the light-shielding member needs to be provided with an opening for connecting a contact plug at a position corresponding to an active region where an amplification transistor and the like are provided. As a result, light may be incident on the charge holding portion.

SUMMARY

The present disclosure is directed to making light less likely to be incident on a charge holding portion by suitably arranging an active region, the charge holding portion, and a light-shielding member.

According to an aspect of the present disclosure, a photoelectric conversion apparatus includes a plurality of pixels each including a plurality of pixels each including a photoelectric conversion portion, a charge holding portion disposed in a region not overlapping the photoelectric conversion portion in a planar view and configured to hold a charge generated in the photoelectric conversion portion, a floating diffusion to which the charge is transferred from the charge holding portion, and a first transistor and a second transistor. The first transistor and the second transistor are disposed in a common active region. The active region includes a partial region as a part of the first transistor and a part of the second transistor. The partial region includes a first region extending in a first direction in the planar view, a second region connected to the first region and extending in a second direction crossing the first direction in the planar view, and a third region connected to the second region and extending in a third direction opposite to the first direction in the planar view, the third region being a part of the second transistor. In the planar view, the partial region of a first pixel among the plurality of pixels is disposed between a gate of the first transistor of the first pixel and the charge holding portion of a second pixel adjacent to the first pixel among the plurality of pixels, and between a gate of the second transistor of the first pixel and the charge holding portion of the second pixel. The first transistor is a reset transistor, and the second transistor is an amplification transistor. A light-shielding member is disposed in a region overlapping the partial region in the planar view.

According to another aspect of the present disclosure, a photoelectric conversion apparatus includes a plurality of pixels each including a photoelectric conversion portion, a charge holding portion disposed in a region not overlapping the photoelectric conversion portion in a planar view and configured to hold a charge generated in the photoelectric conversion portion, a floating diffusion to which the charge is transferred from the charge holding portion, and a first transistor and a second transistor. The first transistor and the second transistor are disposed in a common active region. The active region includes a partial region as a part of the first transistor and a part of the second transistor. The partial region includes a first region extending in a first direction in the planar view, a second region connected to the first region and extending in a second direction crossing the first direction in the planar view, and a third region connected to the second region and extending in a third direction opposite to the first direction in the planar view. The third region is a part of the second transistor. In the planar view, the partial region of a first pixel among the plurality of pixels is disposed between a gate of the first transistor of the first pixel and the charge holding portion of a second pixel adjacent to the first pixel among the plurality of pixels, and between a gate of the second transistor of the first pixel and the charge holding portion of the second pixel. A light-shielding member is disposed in a region overlapping the partial region in the planar view. The light-shielding member is continuous from a light-shielding member disposed in a region overlapping the charge holding portion of the second pixel.

According to yet another aspect of the present disclosure, a photoelectric conversion apparatus includes a plurality of pixels each including a photoelectric conversion portion, a charge holding portion disposed in a region not overlapping the photoelectric conversion portion in a planar view and configured to hold a charge generated in the photoelectric conversion portion, a floating diffusion to which the charge is transferred from the charge holding portion, a first transistor, a second transistor, and a third transistor. The first transistor and the second transistor are disposed in a common active region. The third transistor is connected to the floating diffusion and configured to change a capacitance value of the floating diffusion. The active region includes a partial region as a part of the first transistor and a part of the second transistor. The partial region includes a first region extending in a first direction in the planar view, a second region connected to the first region and extending in a second direction crossing the first direction in the planar view, and a third region connected to the second region and extending in a third direction opposite to the first direction in the planar view. The third region is a part of the second transistor. In the planar view, the partial region of a first pixel among the plurality of pixels is disposed between a gate of the first transistor of the first pixel and the charge holding portion of a second pixel adjacent to the first pixel among the plurality of pixels, and between a gate of the second transistor of the first pixel and the charge holding portion of the second pixel. A light-shielding member is disposed in a region overlapping the partial region in the planar view.

Further features of the disclosure will become apparent from the following description of exemplary embodiments with reference to the attached drawings.

DESCRIPTION OF THE EMBODIMENTS

Figure 1:
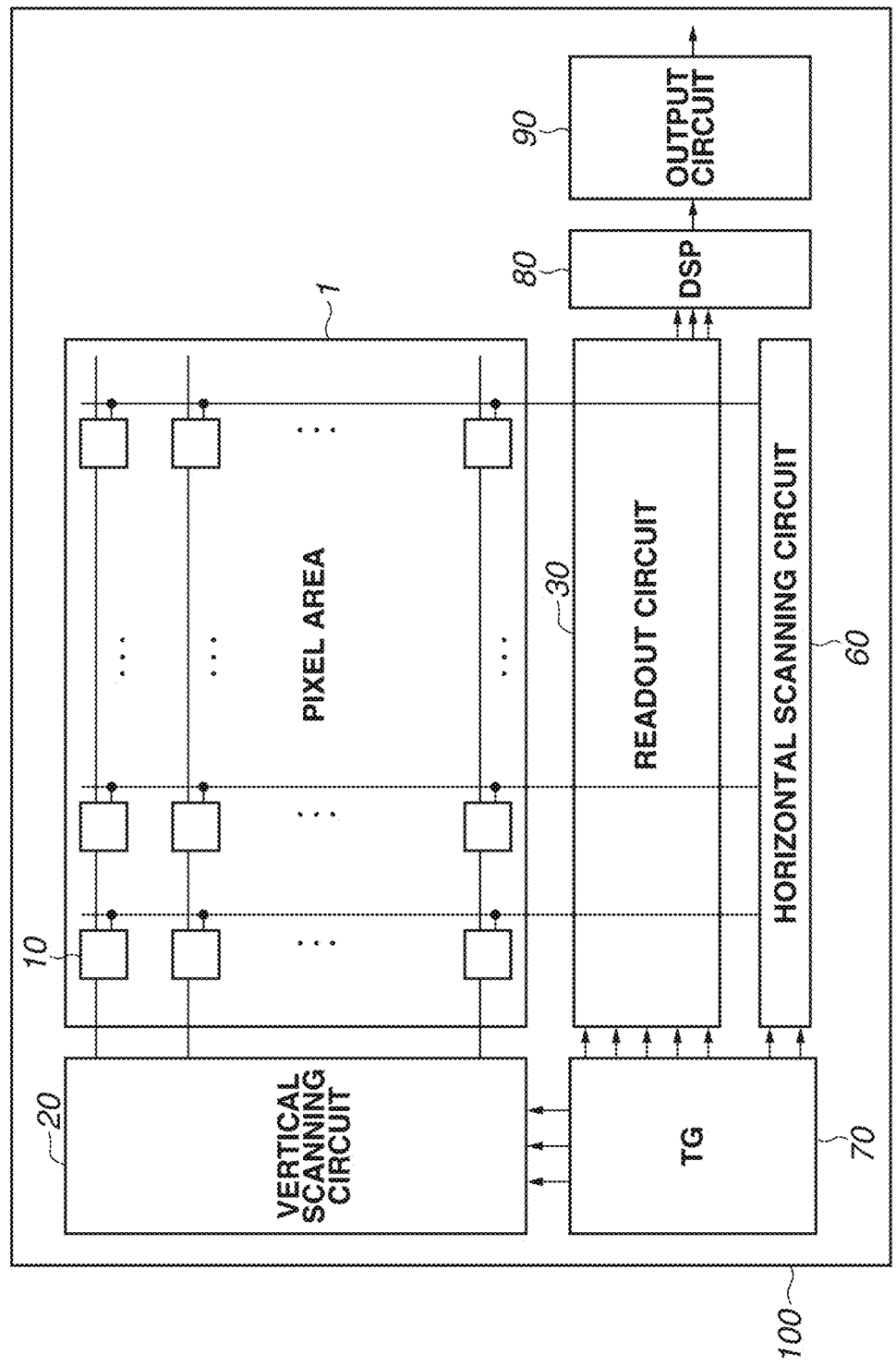
FIG. 1 is a block diagram illustrating a configuration example of a photoelectric conversion apparatus according to a first exemplary embodiment.

Modes for carrying out the disclosure will be described below with reference to the accompanying drawings. Configurations described in the following exemplary embodiments are merely examples, and the disclosure is not limited to the configurations illustrated in the drawings. The size, positional relationship, and the like of members illustrated in the drawings may be exaggerated for clarity.

In the following exemplary embodiments, the same components are denoted by the same reference numerals, and the descriptions thereof may be omitted.

The following exemplary embodiments illustrate a case where electrons are used as signal charges. However, the same advantageous effects can also be obtained by using positive holes as signal charges. In the following exemplary embodiments, a semiconductor region of a first conductivity type is a region with electrons as majority carriers and a semiconductor region of a second conductivity type is a region with positive holes as majority carriers, and may be vice versa.

Figure 2:
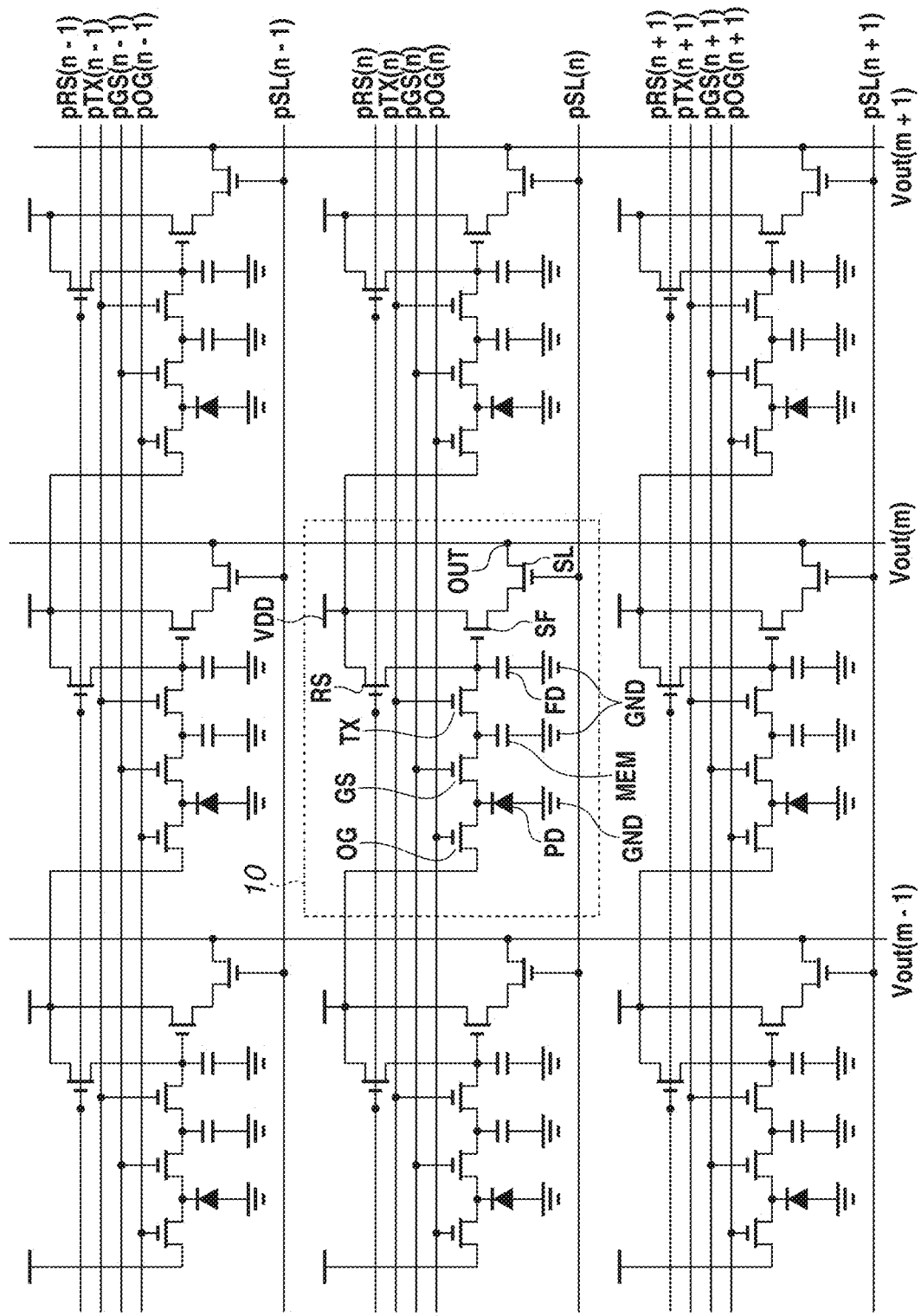
FIG. 2 is a circuit diagram illustrating a pixel circuit of the photoelectric conversion apparatus according to the first exemplary embodiment.
Figure 3:
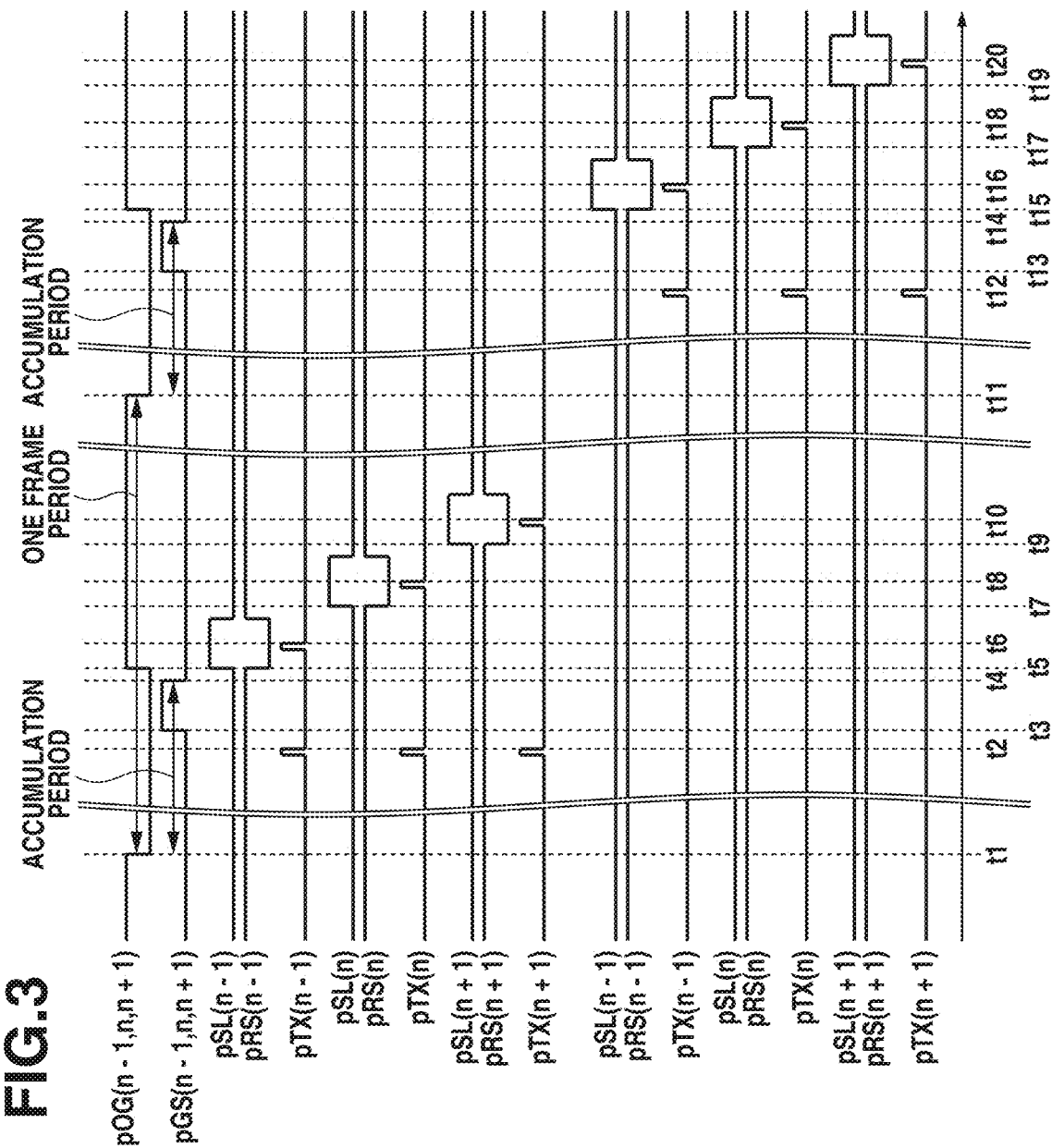
FIG. 3 is a timing diagram illustrating an example of driving the photoelectric conversion apparatus according to the first exemplary embodiment.
Figure 4:
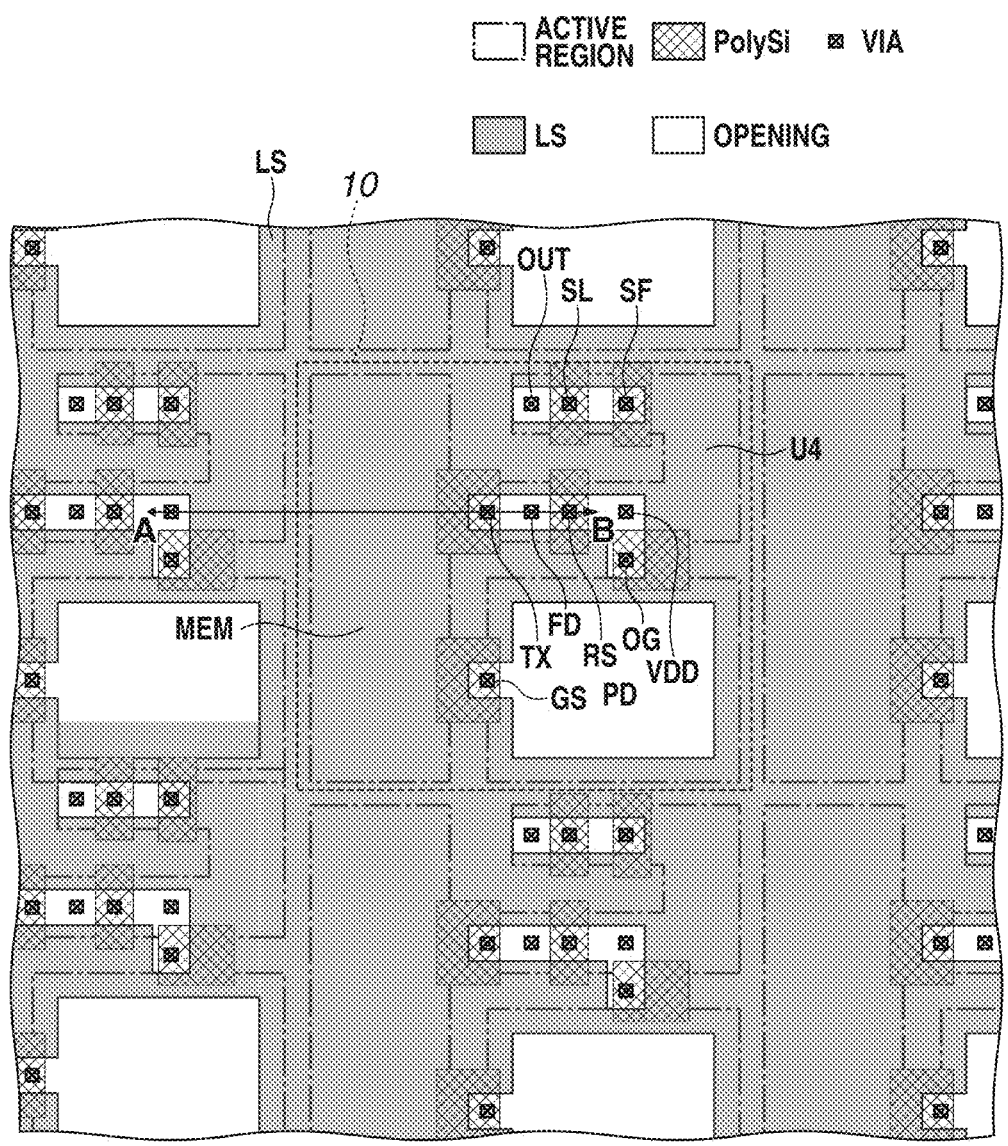
FIG. 4 is an arrangement diagram illustrating pixels of the photoelectric conversion apparatus according to the first exemplary embodiment.
Figure 5:
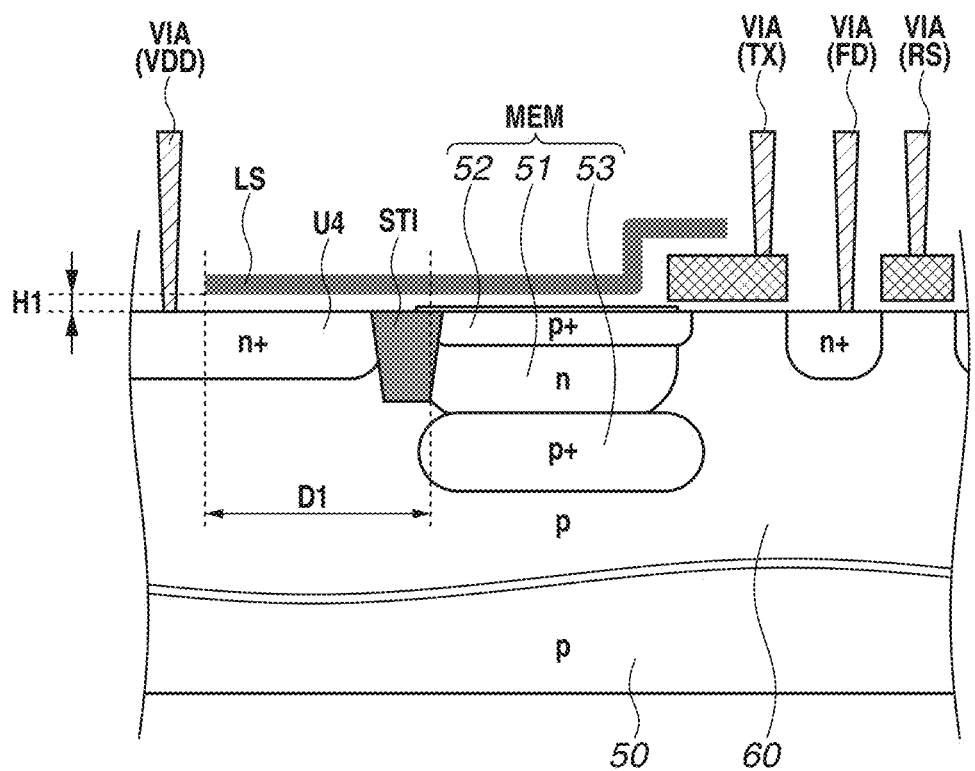
FIG. 5 is a schematic sectional view taken along a line A-B in FIG. 4.

A first exemplary embodiment of the present disclosure will be described below. A photoelectric conversion apparatus 100 according to the present exemplary embodiment will be described below with reference to FIGS. 1 to 5. FIG. 1 is a block diagram illustrating the photoelectric conversion apparatus 100. FIG. 2 is an equivalent circuit diagram illustrating three rows and three columns of pixels 10 included in a pixel area 1 of the photoelectric conversion apparatus 100. FIG. 3 is a drive timing diagram illustrating an operation of the photoelectric conversion apparatus 100. FIG. 4 is an arrangement diagram illustrating the pixels illustrated in FIG. 2. FIG. 5 is a schematic sectional view taken along a line A-B in FIG. 4.

The configuration and operation of the photoelectric conversion apparatus 100 will be briefly described below.

As illustrated in FIG. 1, the photoelectric conversion apparatus 100 includes the pixel area 1 in which the plurality of pixels 10 is two-dimensionally disposed. Signal lines corresponding to the respective columns of the plurality of pixels 10 are disposed. The signal lines are each connected to a readout circuit 30. The readout circuit 30 includes column circuits corresponding to the respective columns of the plurality of pixels 10. Each column circuit performs noise reduction processing, amplification processing, analog-to-digital (AD) conversion processing, and the like on signals output from the pixels 10.

As illustrated in the equivalent circuit diagram of FIG. 2, each of the pixels 10 includes at least a photoelectric conversion portion PD, a charge holding portion MEM, and a floating diffusion PD to which a charge is transferred from the charge holding portion MEM. The photoelectric conversion portion PD, the charge holding portion MEM, and the floating diffusion FD are disposed in a region not overlapping in a planar view. Each of the pixels 10 also includes a first transfer transistor GS that transfers a charge from the photoelectric conversion portion PD to the charge holding portion MEM, and a second transfer transistor TX that transfers a charge from the charge holding portion MEM to the floating diffusion FD. Each of the pixels 10 also includes a discharge transistor OG for discharging a charge from the photoelectric conversion portion PD. In the present exemplary embodiment, each of the pixels 10 includes at least a reset transistor RS for initializing the floating diffusion FD, and an amplification transistor SF that outputs a signal corresponding to a potential of the floating diffusion FD. Each of the pixels 10 also includes a selection transistor SL that connects the amplification transistor SF to each signal line. Each transistor provided in the pixels 10 includes, for example, a metal-oxide semiconductor (MOS) transistor. In the present exemplary embodiment, a first transistor corresponds to the reset transistor RS and a second transistor corresponds to the amplification transistor SF.

FIG. 3 illustrates a timing for driving the plurality of pixels 10 disposed in an (n−1)th row, an n-th row, and an (n+1)th row of the pixel area 1.

At time t1, the gate of the discharge transistor OG in each of the pixels 10 which are provided in the pixel area 1 and on which light is incident is controlled to be turned off, so that charges can be accumulated in the photoelectric conversion portion PD included in each pixel 10.

Before time t2, the second transfer transistor TX in each of the pixels 10 is turned on and the charge is transferred from the charge holding portion MEM to the floating diffusion FD. At time t2, resetting of the charge holding portion MEM is completed. At time t3, the gate of the first transfer transistor GS of each of the pixels 10 in the pixel area 1 is turned on and the charge accumulated in the photoelectric conversion portion PD is transferred to the charge holding portion MEM. After that, at time t4, the gate of the first transfer transistor GS is turned off. Light incident during a period from time t1 to time t4 is photoelectrically converted into electrons in the photoelectric conversion portion PD and the electrons are accumulated and then transferred to the charge holding portion MEM. This operation implements a global shutter.

Further, during a period from time t5 to time t10, the reset transistor RS in the respective rows is sequentially turned off, and the selection transistor SL and the second transfer transistor TX in the respective rows are sequentially turned on. As a result, an operation of transferring the held charge in each row from the charge holding portion MEM to the floating diffusion FD is carried out. At this time, a signal based on the amount of charge transferred to the floating diffusion FD is read out from a pixel output unit OUT, which is illustrated in FIG. 2, through the amplification transistor SF and the selection transistor SL. A current source (not illustrated) is connected to each signal line illustrated in FIG. 1. When the selection transistor SL is turned on, a current flows through the amplification transistor SF, thereby enabling a source follower operation. In other words, the amplification transistor SF operates as a source follower circuit.

After the readout circuit 30 illustrated in FIG. 1 performs noise reduction processing and AD conversion on the signal read out from the pixel output unit OUT, an output circuit 90 reads the signal to the outside of the photoelectric conversion apparatus 100 through a digital signal processor (DSP) 80. After that, the operation to be performed during the period from time t1 to t10 is repeated after time t11. A period during time t1 and time t11 corresponds to one frame period. One frame period described herein refers to a period from a time when a vertical scanning circuit 20 starts scanning (vertical scanning) for individual rows of the plurality of pixels 10 to a time when vertical scanning for the last row is finished. For example, in the case of dividing a pixel array into a plurality of fields and reading a signal from each field, one frame period may be a period from a time when a row is selected once by the vertical scanning circuit 20 to a time when the row is selected again by the vertical scanning circuit 20. In a case where the photoelectric conversion apparatus 100 is an image capturing device, one frame period may be a period from a time when a charge accumulation period of the photoelectric conversion portion to generate one image is started to a time when reading of a pixel signal from the pixel area 1 is finished.

The operation described herein is merely an example, and may be changed, as needed, in the case of performing a global electronic shutter operation. For example, time t11 may be set prior to time t10 to improve a frame rate. In other words, a certain frame period may overlap another frame period. For example, in a certain frame period, after the transfer of the charge from the photoelectric conversion portion PD to the charge holding portion MEM is finished, a period in which the charge is output from the charge holding portion MEM in each pixel to the pixel output unit OUT may overlap a period in which the charge is accumulated in the photoelectric conversion portion PD in another frame period.

FIG. 3 illustrates an example where reading of a signal from the charge holding portion MEM to the readout circuit 30 is performed for each row. However, reading of a signal from the charge holding portion MEM to the readout circuit 30 may be performed for each area. For example, the reset transistor RS and the selection transistor SL may be controlled for each pixel, and reading of a signal from the charge holding portion MEM to the readout circuit 30 may be performed for each area.

FIG. 4 illustrates an example of a planar arrangement diagram illustrating some of the pixels 10 in the photoelectric conversion apparatus 100. Components illustrated in the pixel circuit diagram of FIG. 2 are disposed on a semiconductor substrate. For example, the photoelectric conversion portion PD, the charge holding portion MEM, the floating diffusion FD, and a channel of each transistor are disposed on the semiconductor substrate.

In the example illustrated in FIG. 4, three active regions included in each pixel are disposed in such a manner that the active regions are separate from each other. A plurality of semiconductor regions (first semiconductor regions) of the first conductivity type is provided in the active region in which the channel of each transistor, such as the reset transistor RS, is provided. In the active region in which the channel of each transistor, a plurality of semiconductor regions (second semiconductor regions) of the second conductivity type is provided as the channel of the each transistor. In the present exemplary embodiment, the plurality of second semiconductor regions includes at least a second semiconductor region serving as the channel of the reset transistor RS, and the second semiconductor region serving as the channel of the amplification transistor SF. An active region in which the photoelectric conversion portion PD is disposed includes a semiconductor region (third semiconductor region) of the first conductivity type. The active region in which the photoelectric conversion portion PD is disposed includes a fourth semiconductor region of the second conductivity type. An active region in which the charge holding portion MEM is disposed includes a semiconductor region (fifth semiconductor region) of the first conductivity type. The active region in which the charge holding portion MEM is disposed includes a semiconductor region (sixth semiconductor region) of the second conductivity type.

In order to reduce the incidence of light on the charge holding portion MEM, a light-shielding member LS is disposed in a region overlapping the semiconductor substrate in the planar view.

In the light-shielding member LS, an opening is provided in a region overlapping the photoelectric conversion portion PD in the planar view, and an opening is also provided in a region overlapping a region in which a connection portion VIA for supplying a potential to drive each transistor is disposed.

In the present exemplary embodiment, the reset transistor RS and the amplification transistor SF are formed in a common active region. Specifically, the channel of the reset transistor RS and the channel of the amplification transistor SF are formed in the active region that are continuously formed. A common active region described herein refers to a region that is not isolated by isolation, such as PN isolation and/or insulator isolation. For example, as illustrated in FIG. 4, an isolation portion STI as an insulator is disposed around the active region in which the channel of the reset transistor RS is formed. The region surrounded by the isolation portion STI corresponds to the common active region.

As illustrated in FIG. 4, the active region includes a partial region U4 as a part of the first transistor and a part of the second transistor. The partial region U4 includes a first region extending in a first direction in the planar view, a second region that is connected to the first region and extends in a second direction crossing the first direction in the planar view, and a third region that is a part of the second transistor, is connected to the second region, and extends in a third direction opposite to the first direction in the planar view. As illustrated in FIG. 4, in the present exemplary embodiment, the partial region U4 which is located between the reset transistor RS, which is the first transistor, and the amplification transistor SF, which is the second transistor, is formed to appear to fold back in a U-shape in the planar view.

In the planar view, the partial region U4 of a first pixel 10 among the plurality of pixels 10 is disposed between the gate of the first transistor of the first pixel 10 and the charge holding portion MEM of a second pixel 10 that is adjacent to the first pixel 10 among the plurality of pixels 10. The partial region U4 of the first pixel 10 is disposed between the gate of the second transistor of the first pixel 10 and the charge holding portion MEM of the second pixel. In other words, a part of the partial region U4 is disposed between the gate of the first transistor of the first pixel 10 and the charge holding portion MEM of the second pixel 10, and another part of the partial region U4 is disposed between the gate of the second transistor of the first pixel 10 and the charge holding portion MEM of the second pixel.

The partial region U4 is disposed adjacent to a side, closer to the first pixel (first side), of the charge holding portion MEM of the second pixel 10. The photoelectric conversion portion PD of the first pixel 10 is disposed adjacent to the first side.

The light-shielding member LS is provided in a region overlapping the partial region U4 in the planar view. As illustrated in FIG. 4, no transistor is disposed between the reset transistor RS and the amplification transistor SF. That is, there is no need to provide a contact plug for connecting a transistor in the partial region U4, and thus no opening is provided in the light-shielding member LS in a region overlapping the partial region U4. According to the present exemplary embodiment, the light-shielding member LS is disposed between the charge holding portion MEM included in adjacent pixels 10 and the opening provided to connect a contact plug in the connection portion VIA. Therefore, the distance between the charge holding portion MEM and the opening can be secured and the amount of light that passes through the opening and is incident on the adjacent charge holding portions MEM can be reduced.

Referring to FIG. 4, a plurality of connection portions VIA is disposed on the same side of the photoelectric conversion portion PD of a certain pixel. For example, the reset transistor RS, the transfer transistor TX, the floating diffusion FD, the amplification transistor SF, and the selection transistor SL are formed in the common active region. Thus, it is possible to reduce a region for forming a single opening while controlling the number of openings formed in the light-shielding member LS.

FIG. 5 is a sectional view taken along a line A-B in FIG. 4. During a period in which the charge is held in the charge holding portion MEM, when a charge resulting from light that has entered from the opening of the light-shielding member LS other than the photoelectric conversion portion PD enters the charge holding portions MEM of the adjacent pixels 10, the amount of the held charge varies and the variation causes noise, which leads to a degradation in image quality. According to the present exemplary embodiment, the distance between the opening in which the connection portion VIA of a certain pixel 10 is disposed and the charge holding portions MEM of the adjacent pixels 10 is secured and the light-shielding member LS is disposed in the partial region U4 that is located between the opening and the charge holding portions MEM of the adjacent pixels 10. This configuration makes a charge less likely to enter the charge holding portions MEM of the adjacent pixels 10.

The charge holding portion MEM in the present exemplary embodiment includes a holding region 51 that includes an N-type semiconductor region of the first conductivity type and holds a signal charge until the second transfer transistor TX is turned on. The holding region 51 is sandwiched between a depletion control region 53 and a surface protection region 52 including a P-type semiconductor region of the second conductivity type. This configuration makes an undesired charge resulting from a crystal defect on the surface of the semiconductor substrate less likely to enter the charge holding portions MEM.

Referring back to FIG. 4, the connection portion VIA of a pixel power supply VDD disposed between the reset transistor RS and the amplification transistor SF is formed at a position that is between the reset transistor RS and the charge holding portion MEM of the adjacent pixel 10 and is sufficiently separate from the charge holding portion MEM. A high potential is generally supplied to the pixel power supply VDD, so that the first semiconductor region of the partial region U4 is maintained at a high potential. With this configuration, the undesired charge resulting from light that has entered from the opening is absorbed by the partial region U4 of the first semiconductor region, which efficiently controls entering of the undesired charge into the holding region 51 of the charge holding portion MEM.

As illustrated in FIG. 5, the light-shielding member LS is continuous from the light-shielding member LS disposed in a region overlapping the charge holding portion MEM of the adjacent pixel. In other words, the light-shielding member LS is integrally formed with another light-shielding member LS that overlaps the charge holding portion MEM.

The light-shielding member LS is disposed such that a distance from a surface of the semiconductor substrate on which the gate of the reset transistor RS is provided (first surface) to an upper end of the light-shielding member LS is shorter than a distance from the first surface to an upper end of a contact plug which is connected to the connection portion VIA. The light-shielding member LS is disposed at a position that is lower than a wire that is in direct contact with the contact plug and is higher than the first surface of the semiconductor substrate. This configuration makes light less likely to enter a space between the light-shielding member LS and the surface of the semiconductor substrate.

A distance D1 from an end of an opening, which overlaps a region other than the photoelectric conversion portion PD in a certain pixel, on a side closer to a charge holding portion MEM to an end of the holding region 51 of the charge holding portion MEM of an adjacent pixel 10 on a side closer to the certain pixel 10 is desirably separate from the opening so that the distance D1 is at least ten times greater than a height H1 from a surface of the semiconductor substrate on which the light-shielding member LS is disposed to the light-shielding member LS. This is a distance long enough to sufficiently attenuate light diffracted in the opening before entering the charge holding portion MEM. It is more desirable that the distance D1 be at least 15 times greater than the height H1.

The configuration described in the present exemplary embodiment makes undesired charge less likely to enter the charge holding portions MEM of the adjacent pixels 100, which reduces noise, and thus improves the image quality.

In an example illustrated in FIG. 5 among others, the charge holding portion MEM has a configuration of an implanted photodiode type, but instead may have, for example, a transistor type configuration in which the first surface of the semiconductor substrate is covered with a gate. The conductivity type and configuration of an impurity region of the semiconductor substrate and a well 60, the configuration of the isolation portion STI, and the like may be changed as needed.

As illustrated in FIG. 4, only one connection portion VIA is provided for a single transistor, but instead a plurality of connection portions VIA may be provided for a single transistor to reduce a resistance, for example. In such a case, there is a possibility that the number of openings to be formed in the light-shielding member LS may increase. Accordingly, a plurality of connection portions VIA may be disposed only in an area remote from the charge holding portion MEM, or other configurations can be selected as appropriate.

In the present exemplary embodiment described above, only the pixels 10 is illustrated on which light is incident (the pixels are hereinafter referred to as effective pixels) as pixels provided in the pixel area 1. However, the arrangement of pixels is not limited to this example. For example, an optical black pixel in which the photoelectric conversion portion PD is light-shielded may be further provided. This optical black pixel may be configured to perform a global shutter operation at the same timing as that for the effective pixels by the operation illustrated in FIG. 3. The optical black pixel may reset the photoelectric conversion portion PD and read a signal from the photoelectric conversion portion PD at a timing different from that of the effective pixels. A signal from the optical black pixel can detect a dark current component of the photoelectric conversion portion PD. A dummy pixel that does not include the photoelectric conversion portion PD may be further provided in the pixel area 1. A noise level of the amplification transistor SF can be detected by using a signal from the dummy pixel.

In the global shutter operation described in the present exemplary embodiment, there is no need for all the effective pixels to have the same signal accumulation period. For example, the pixel area 1 is divided into a plurality of areas and different signal accumulation periods are set for the respective areas. The pixels 10 in a plurality of rows and a plurality of columns included in one of the areas may have the same signal accumulation period.

A thinning-out operation in which no signal is read from the pixels 10 in some rows of the pixel area 1 may be carried out. In the pixels 10 on which the thinning-out operation is performed, the timing for resetting the photoelectric conversion portion PD and reading a signal from the photoelectric conversion portion PD may be different from that for the effective pixels. For example, the photoelectric conversion portion PD may be continuously reset during one frame period. Even in such a case, this operation is also included in the category of the global shutter operation, as long as the pixels 10 in a plurality of rows and a plurality of columns other than the pixels 10 from which a signal is read have the same signal accumulation period.

Modified Example

Figure 6:
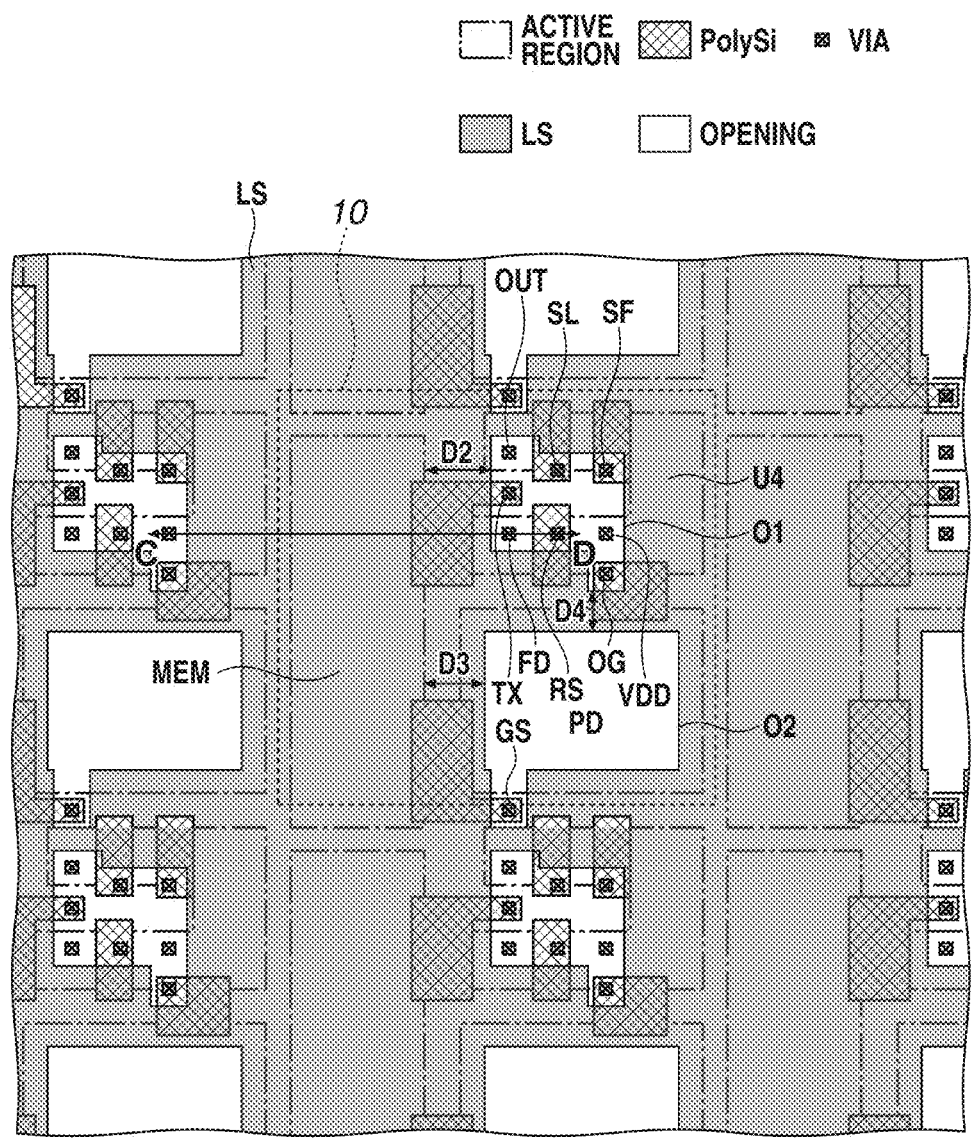
FIG. 6 is a pixel arrangement diagram according to a modified example of the photoelectric conversion apparatus according to the first exemplary embodiment.
Figure 7:
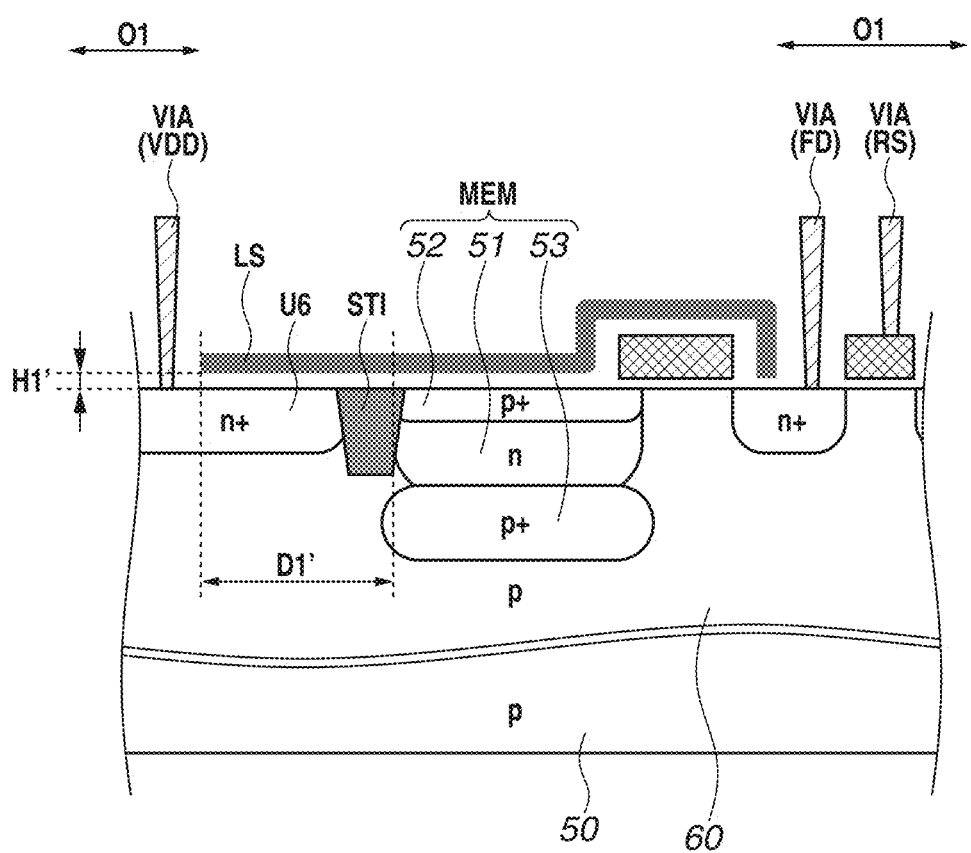
FIG. 7 is a schematic sectional view taken along a line C-D in FIG. 6.

FIGS. 6 and 7 each illustrate a modified example of the photoelectric conversion apparatus 100 according to the first exemplary embodiment. FIG. 6 is a planar view of the photoelectric conversion apparatus 100. FIG. 7 is a sectional view taken along a line C-D in FIG. 6.

As in the configuration illustrated in FIG. 4, a configuration including the partial region U4 as a part of the reset transistor RS and a part of the amplification transistor SF is employed. In the configuration illustrated in FIG. 6, the arrangement of the connection portion VIA for supplying a potential to gate electrodes of the first transfer transistor GS, the second transfer transistor TX, and the like is changed from the planar arrangement diagram of FIG. 4. In the configuration illustrated in FIG. 6, the connection portion VIA of each transistor is disposed on the same side as the photoelectric conversion portion PD. The connection portion VIA of each of the transistors, including the amplification transistor SF and the reset transistor RS, is disposed in a region overlapping a single opening O1 in the planar view. As a result, the opening O1 provided in the light-shielding member LS can be disposed at a position remote from the charge holding portion MEM, and entering of light to the charge holding portion MEM can be controlled. As illustrated in FIGS. 6 and 7, a distance D2 between the charge holding portion MEM and the opening O1 in the same pixel is secured, thus controlling entering of light. Further, the area of the opening itself may be reduced by devising the arrangement.

In the configuration illustrated in FIG. 6, the connection portion VIA for sharing a potential with the reset transistor RS, the connection portion VIA for sharing a potential with the amplification transistor SF, and the connection portion VIA for sharing a potential with the second transfer transistor TX are disposed in a region overlapping a single opening O1 in the planar view. The connection portion VIA for supplying a potential to the first transfer transistor GS is disposed in an opening O2 disposed in a region overlapping the photoelectric conversion portion PD in the planar view.

A distance D3 from an end of the opening O2 in a certain pixel 10 to the charge holding portion MEM in the same pixel 10 is longer than a distance D4 from an end of the opening O1 to an end of the opening O2. The distance D2 from an end of the opening O1 in a certain pixel 10 to the charge holding portion MEM in the same pixel 10 is longer than the distance D4 from an end of the opening O1 to an end of the opening O2. Accordingly, entering of light into the charge holding portion MEM in the same pixel 10 and the charge holding portion MEM in the adjacent pixel 10 can be controlled.

The configuration described in the present exemplary embodiment makes light less likely to be incident on the charge holding portions MEM in the adjacent pixels and the charge holding portion MEM in the same pixel, which reduce noise, and thus improves the image quality.

Figure 8:
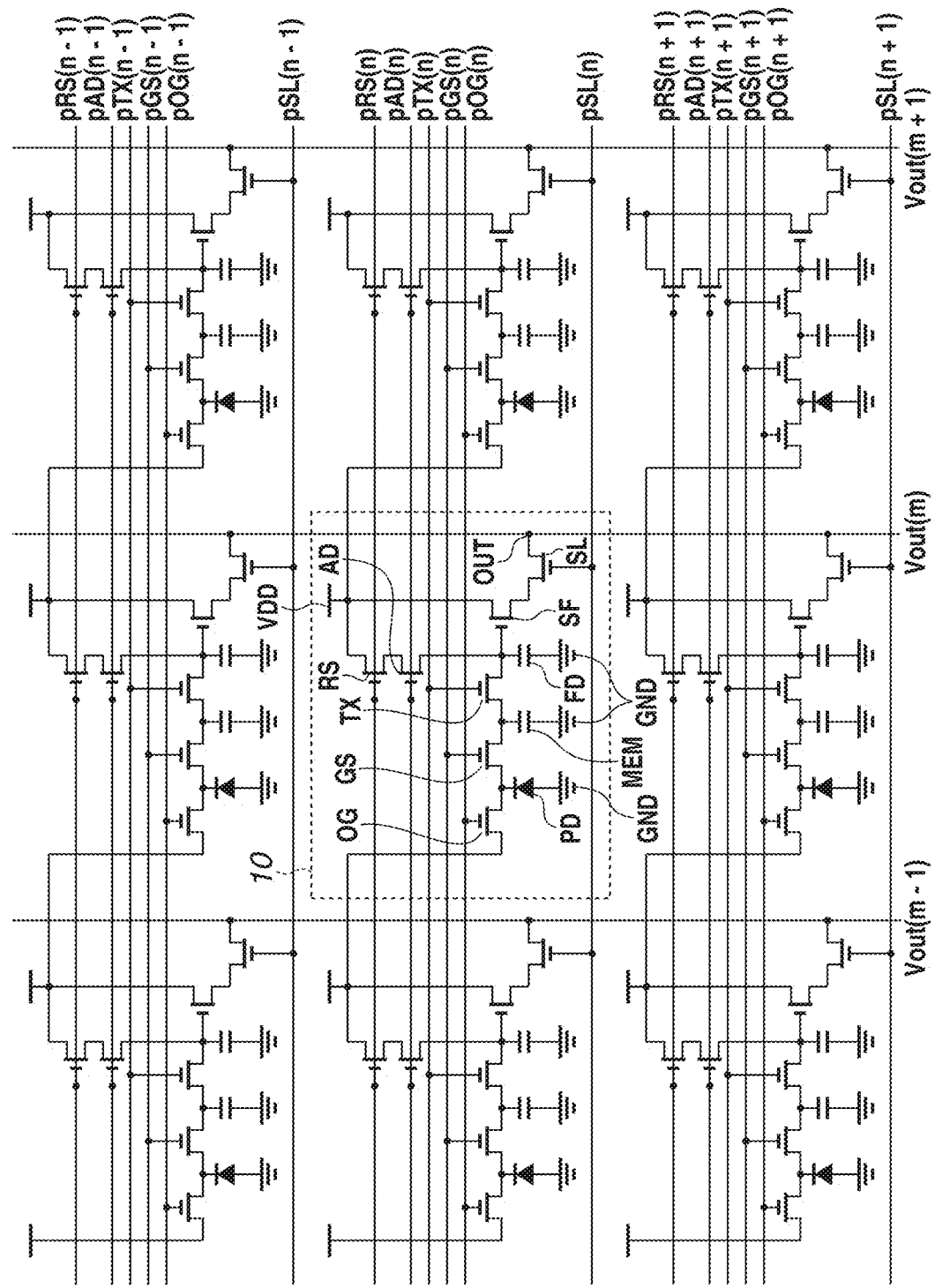
FIG. 8 is a circuit diagram illustrating a pixel circuit of a photoelectric conversion apparatus according to a second exemplary embodiment.

A second exemplary embodiment of the present disclosure will be described. A photoelectric conversion apparatus according to the present exemplary embodiment will be described with reference to FIGS. 8 and 9. A circuit diagram of a pixel area illustrated in FIG. 8 differs from the circuit diagram of the first exemplary embodiment illustrated in FIG. 2 in that a capacitance addition transistor AD (third transistor) connected to each of the floating diffusion FD and the reset transistor RS is added.

The capacitance addition transistor AD is mainly used to increase a dynamic range of the photoelectric conversion apparatus 100. The capacitance addition transistor AD varies the capacitance value of the floating diffusion PD. For example, when the capacitance addition transistor AD is turned on, the capacitance of the floating diffusion FD increases and a variation in potential can be minimized even in the case of reading the same amount of charge. As a result, more charges can be treated and thus the dynamic range of the photoelectric conversion apparatus 100 can be increased.

On the other hand, as the number of transistors included in each pixel of the photoelectric conversion apparatus 100 increases, the number of the connection portions VIA also increases. This results in the opening of the light-shielding member LS and the charge holding portion MEM of the adjacent pixel 10 being in close proximity to each other, so that light is more likely to enter the charge holding portions MEM.

Figure 9:
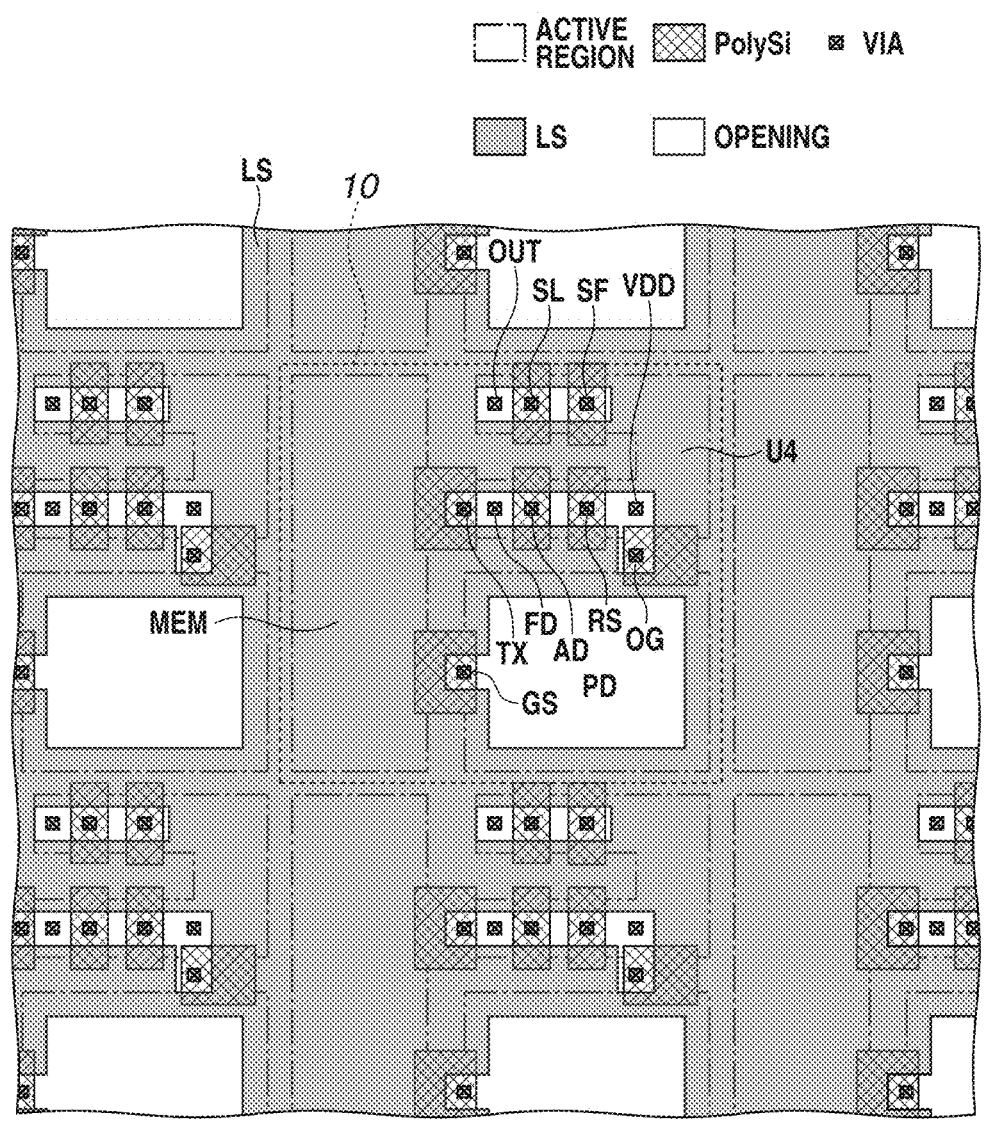
FIG. 9 is an arrangement diagram illustrating pixels of the photoelectric conversion apparatus according to the second exemplary embodiment.

Thus, as illustrated in the planar arrangement diagram of FIG. 9, the addition capacitance transistor AD, the reset transistor RS, the amplification transistor SF, and the selection transistor SL are formed in the common active region. That is, each transistor is formed in the active region continuously formed. The partial region U4 being a part of the reset transistor RS and a part of the amplification transistor SF is provided, and the light-shielding member LS is disposed in a region overlapping the partial region U4 in the planar view.

With this configuration, even if the number of the connection portions VIA in the second exemplary embodiment is greater than that in the first exemplary embodiment, a sufficiently large distance between the opening of the light-shielding member LS and the charge holding portion MEM can be secured, thus entering of light can be reduced. The first semiconductor region having a high potential is disposed between the opening and the charge holding portion MEM, thus making undesired charge difficult to enter the charge holding portion MEM.

The configuration described above in the present exemplary embodiment controls entering of light into the charge holding portion MEM and reduces noise even in a case where the capacitance addition transistor AD is added and the number of components of each pixel is increased. Consequently, the image quality can be improved.

Figure 10:
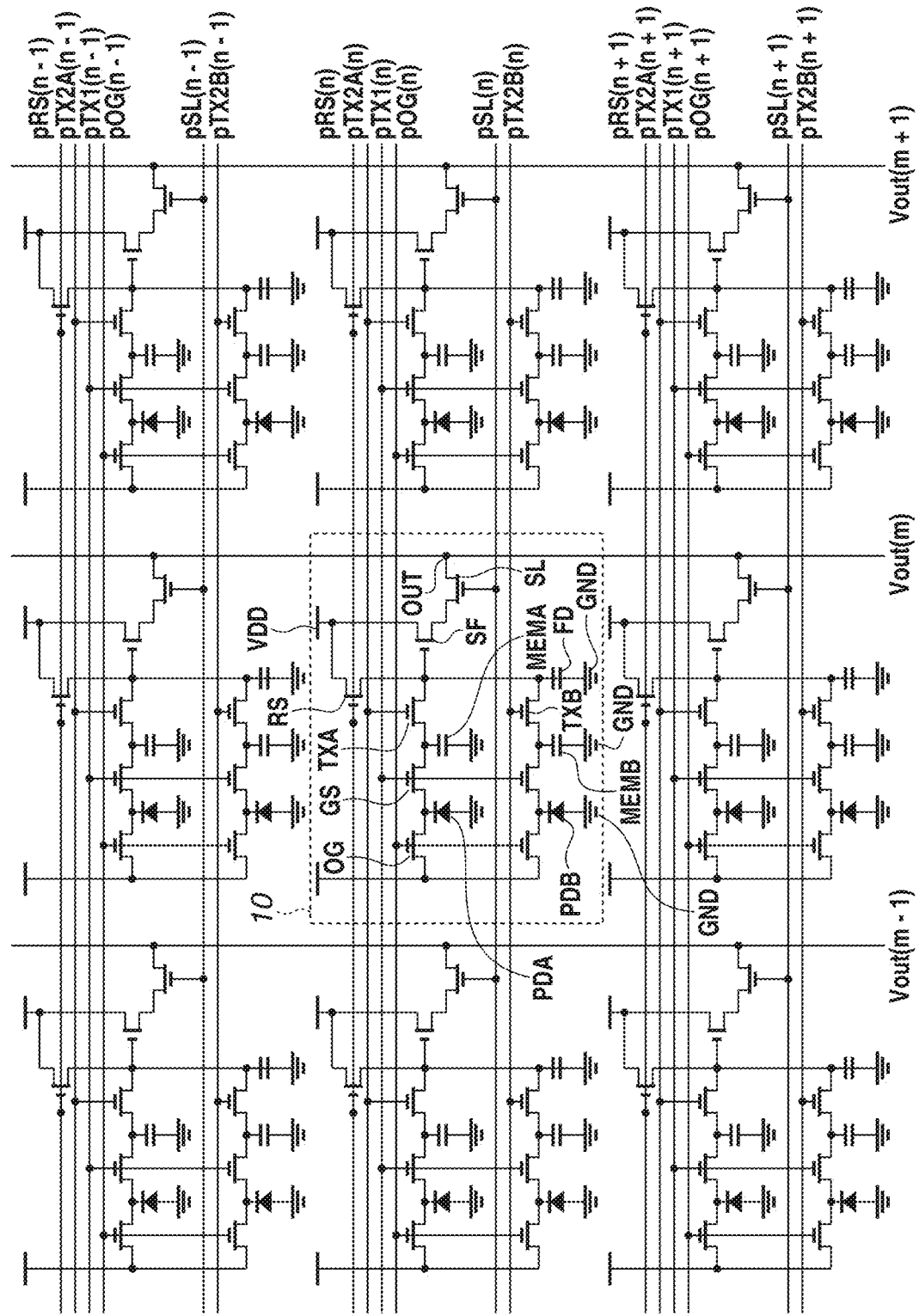
FIG. 10 is a circuit diagram illustrating a pixel circuit of a photoelectric conversion apparatus according to a third exemplary embodiment.

A third exemplary embodiment of the present disclosure will be described below. A photoelectric conversion apparatus according to the present exemplary embodiment will be described with reference to FIGS. 10 and 11. A pixel circuit diagram illustrated in FIG. 10 differs from the circuit diagram of the first exemplary embodiment illustrated in FIG. 2 in that a single pixel includes a plurality of photoelectric conversion portions PDA and PDB and a plurality of charge holding portions MEMA and MEMB. A configuration in which the plurality of charge holding portions MEMA and MEMB shares circuit elements including the floating diffusion FD and the subsequent elements is employed. In order to improve the resolution of the photoelectric conversion apparatus 100, in the case of providing a plurality of photoelectric conversion portions PD, the size of each pixel 10 may be reduced. In such a case, a method in which the plurality of photoelectric conversion portions PD shares transistors including the floating diffusion FD and subsequent elements to reduce the arrangement area of the readout circuit 30 of each pixel.

Figure 11:
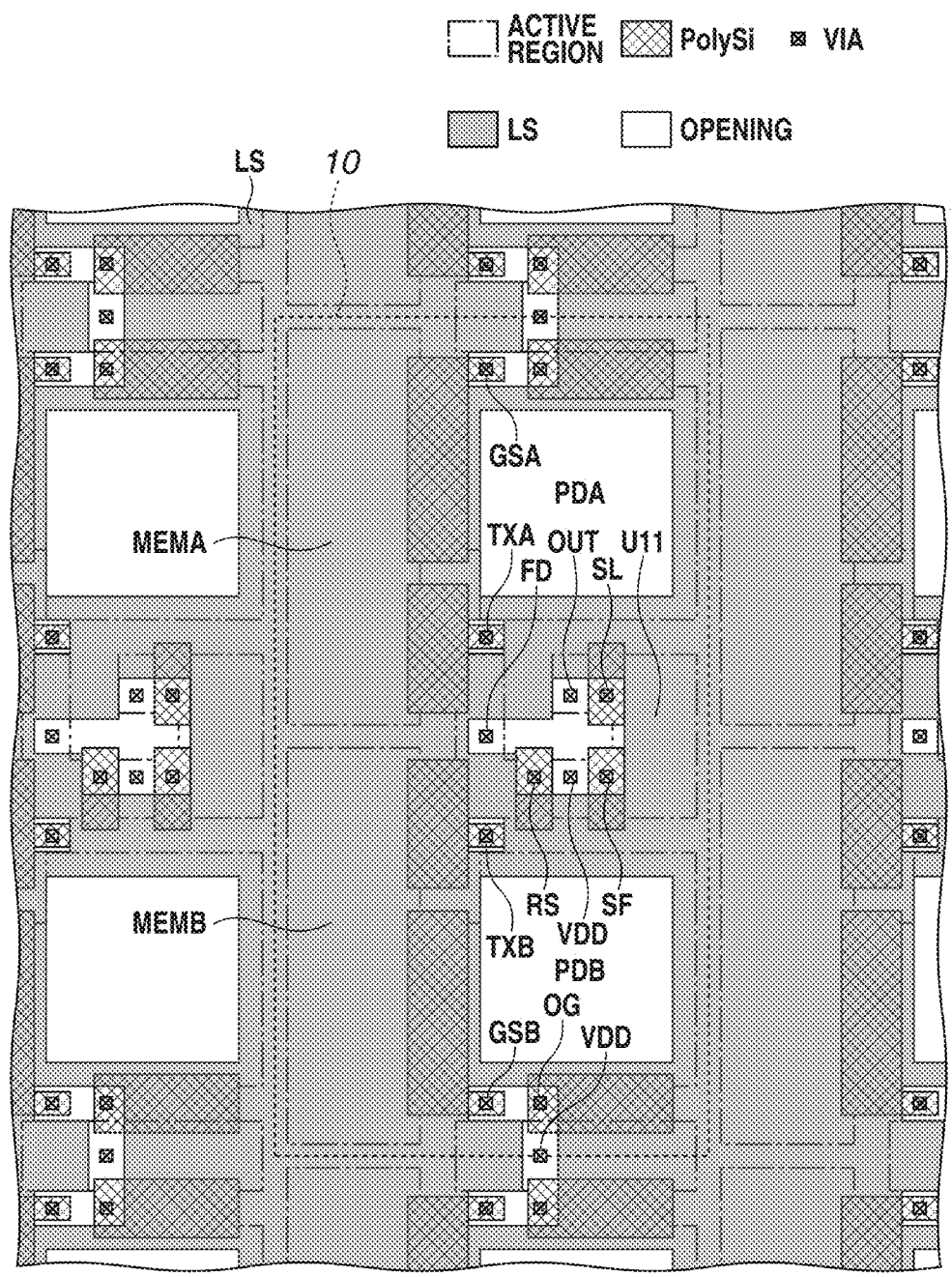
FIG. 11 is an arrangement diagram illustrating pixels of the photoelectric conversion apparatus according to the third exemplary embodiment.

A planar arrangement diagram illustrated in FIG. 11 differs from that of the first exemplary embodiment illustrated in FIG. 4 in that, in addition to a pixel sharing configuration, the partial region U4 of the active region is a part of the amplification transistor SF and a part of the selection transistor SL. There is no need to provide a potential between the amplification transistor SF and the selection transistor SL, and thus, the connection portion VIA need not necessarily be disposed. In addition, the potential is lowered from the pixel power supply VDD to about a level corresponding to an operation threshold of the amplification transistor SF. Accordingly, the undesired charge is more likely to be captured at a relatively high potential. Thus, a part of the active region between the amplification transistor SF and the selection transistor SL is disposed between the charge holding portion MEM and the opening, thereby securing a long distance from the charge holding portion MEM to the opening and controlling the entering of the undesired charge. The transistors disposed at each end of the partial region U4 are not limited to the amplification transistor SF and the selection transistor SL, but instead may be other transistors.

In the present exemplary embodiment, it is also desirable that the light-shielding member LS be disposed such that the distance D1 is at least ten times greater than the height H1. This configuration makes it possible to attenuate the light, which has passed through the opening of a certain pixel and travels to the adjacent charge holding portion MEM, before entering the charge holding portion MEM. More preferably, the light-shielding member LS is disposed such that the distance D1 is at least 15 times greater than the height H1.

The configuration described in the present exemplary embodiment controls entering of undesired charge into the charge holding portion MEM, which reduces noise, even when the size of each pixel 10 is reduced, thus improving image quality.

Figure 12:
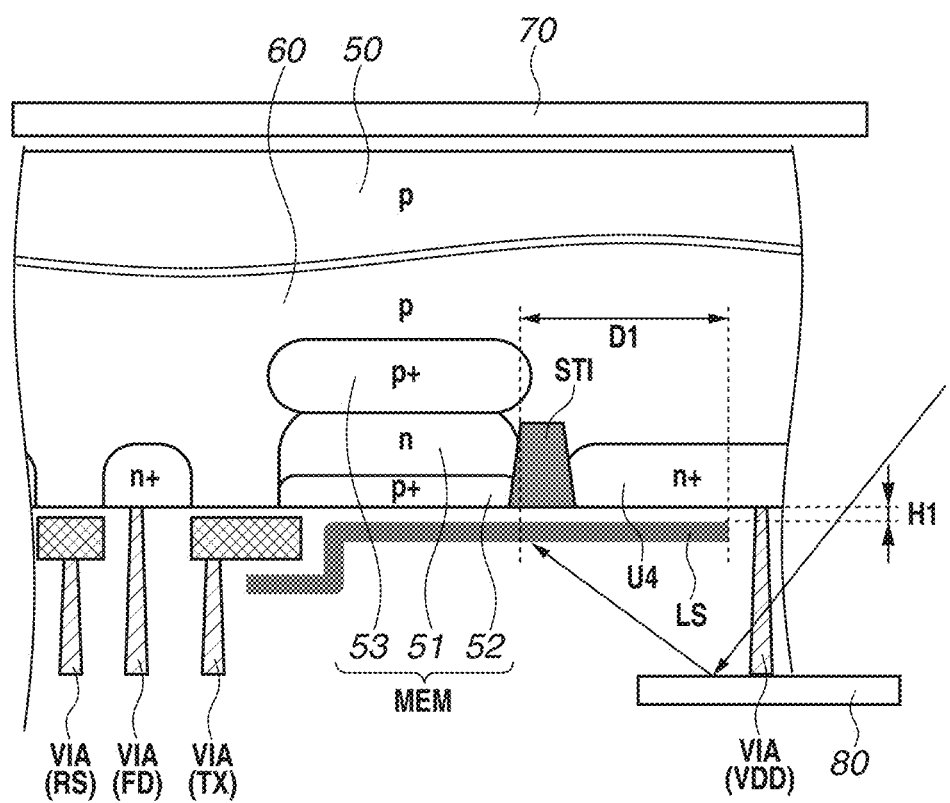
FIG. 12 is a sectional view illustrating a pixel of a photoelectric conversion apparatus according to a fourth exemplary embodiment.

A fourth exemplary embodiment of the present disclosure will be described below. FIG. 12 illustrates a sectional view of a photoelectric conversion apparatus according to the present exemplary embodiment. The photoelectric conversion apparatus 100 according to the fourth exemplary embodiment includes a pixel circuit and a circuit configuration that are the same as those illustrated in FIG. 4. However, the photoelectric conversion apparatus 100 according to the present exemplary embodiment differs from the photoelectric conversion apparatus 100 according to the first exemplary embodiment in that light is incident on a second surface opposed to the first surface of the semiconductor substrate. The photoelectric conversion apparatus 100 according to the present exemplary embodiment also differs from the photoelectric conversion apparatus 100 according to the first exemplary embodiment in that a light-shielding member 70 is disposed on a side of a surface of the semiconductor substrate that is opposite to the surface where a contact plug is connected. The light-shielding member 70 is provided with an opening in a region overlapping the photoelectric conversion portion PD in the planar view.

Light which has passed through the opening provided in the light-shielding member 70 to cause the light to be incident on the photoelectric conversion portion PD may include light that is not directed toward the photoelectric conversion portion PD but is directed toward a transistor. In such a case, the light may be reflected on a wiring layer 80 to which the contact plug is connected and may be incident on an adjacent charge holding portion MEM, which may generate undesired charge.

According to the present exemplary embodiment, the light reflected on the wiring layer 80 can be reflected by the light-shielding member LS, which makes light less likely to be incident on the charge holding portion MEM. The distance between the light-shielding member LS and the semiconductor substrate is set to be shorter than the length of the contact plug, which makes light less likely to be incident on a space between the light-shielding member LS and the semiconductor substrate. Further, as illustrated in FIG. 12, the configuration in which the partial region U4 is disposed in close proximity to the charge holding portion MEM enables the charge generating near the charge holding portion MEM to be absorbed in the partial region U4. Consequently, the amount of charge to enter the charge holding portion MEM can be reduced and a deterioration in image quality can be prevented.

Since the configuration associated with the partial region U4 in the present exemplary embodiment is the same as that in the first exemplary embodiment, the same advantageous effects as those of the first exemplary embodiment can be obtained. The present exemplary embodiment may be combined with the second and third exemplary embodiments. In such a case, the advantageous effects corresponding to the respective exemplary embodiments can be obtained.

Figure 13:
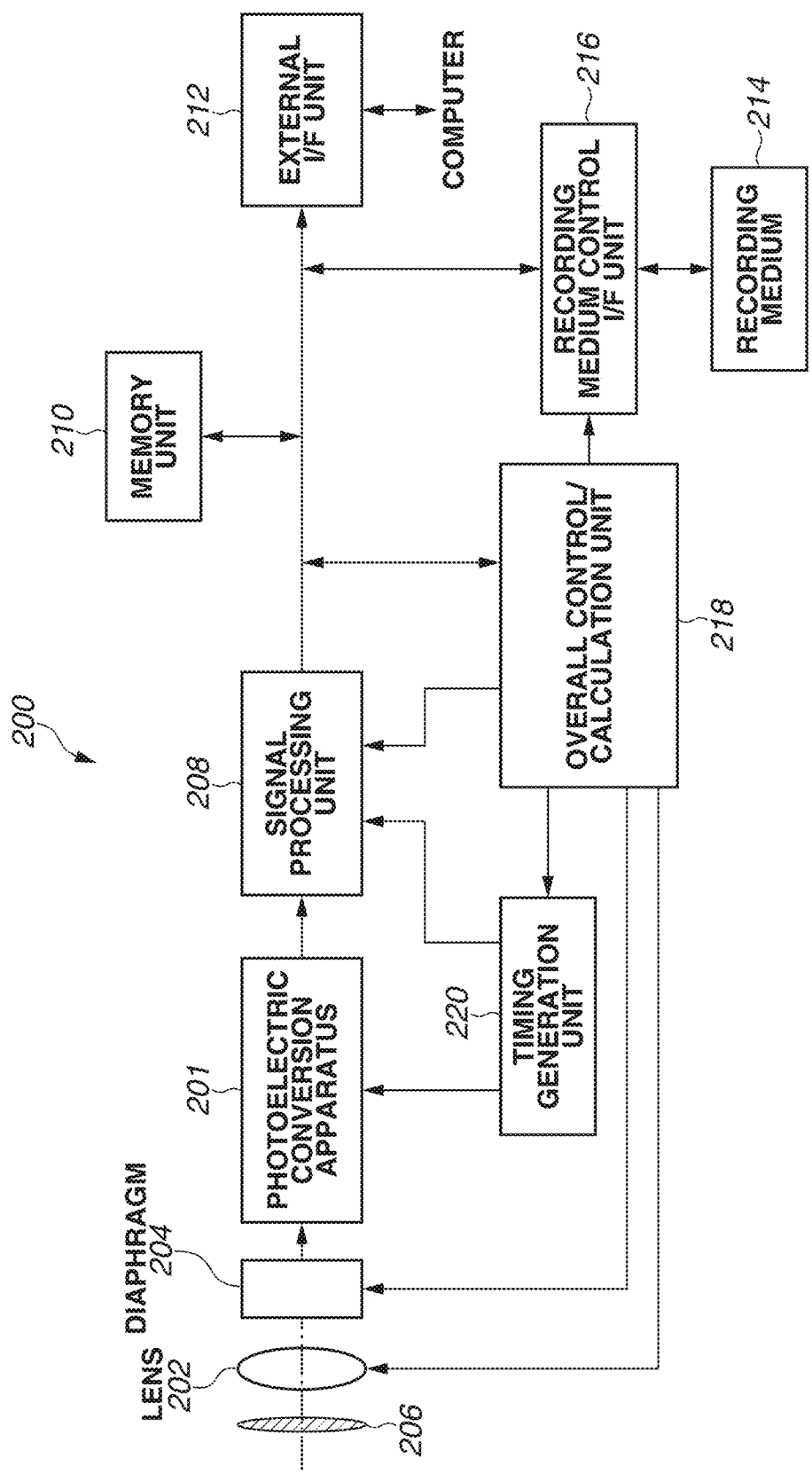
FIG. 13 is a schematic diagram illustrating a photoelectric conversion system according to a fifth exemplary embodiment.

A fifth exemplary embodiment of the present disclosure will be described. A photoelectric conversion system according to the present exemplary embodiment will be described with reference to FIG. 13. FIG. 13 is a block diagram illustrating a schematic configuration of the photoelectric conversion system according to the present exemplary embodiment. Any one of the photoelectric conversion apparatuses according to the first to fourth exemplary embodiments can be used as a photoelectric conversion apparatus 201.

FIG. 13 illustrates an image capturing system as an example of the photoelectric conversion system. Examples of the image capturing system include a digital still camera, a digital camcorder, a monitoring camera, a copying machine, a facsimile, a mobile phone, an on-vehicle camera, and an observation satellite. The photoelectric conversion system is not limited to an image capturing system, but instead may be, for example, a ranging sensor or a photometry sensor. A typical ranging sensor is a sensor used for generating information about a distance to an object. Examples of the ranging sensor include a Time-Of-Flight (TOF) sensor. A typical photometry sensor is a sensor used for detecting the brightness of an object.

A photoelectric conversion system 200 illustrated in FIG. 13 includes the photoelectric conversion apparatus 201, a lens 202 that forms an optical image of an object on the photoelectric conversion apparatus 201, a diaphragm 204 that varies the amount of light passing through the lens 202, and a barrier 206 that protects the lens 202. The lens 202 and the diaphragm 204 are optical systems that collects and condenses light on the photoelectric conversion apparatus 201. The photoelectric conversion apparatus 201, which is an example of the photoelectric conversion apparatuses described in the first to fourth exemplary embodiments, converts an optical image formed by the lens 202 into image data.

The photoelectric conversion system 200 includes a signal processing unit 208 that processes an output signal output from the photoelectric conversion apparatus 201. The signal processing unit 208 performs an AD conversion for converting an analog signal output from the photoelectric conversion apparatus 201 into a digital signal. In addition, the signal processing unit 208 performs various correction and compression operations, as needed, and outputs image data. An AD conversion unit, which is a part of the signal processing unit 208, may be formed on the semiconductor substrate on which the photoelectric conversion apparatus 201 is provided, or may be formed on another semiconductor substrate different from the semiconductor substrate on which the photoelectric conversion apparatus 201 is provided. The photoelectric conversion apparatus 201 and the signal processing unit 208 may be formed on the same semiconductor substrate.

The photoelectric conversion system 200 also includes a memory unit 210 that temporarily stores image data, and an external interface (I/F) unit 212 that communicates with, for example, an external computer. The photoelectric conversion system 200 also includes a recording medium 214, such as a semiconductor memory, that records or reads image capturing data, and a recording medium control I/F unit 216 that records data on the recording medium 214 or reads data from the recording medium 214. The recording medium 214 may be incorporated in the photoelectric conversion system 200, or may be detachably attached to the photoelectric conversion system 200.

The photoelectric conversion system 200 further includes an overall control/calculation unit 218 that controls various calculations and the overall operation of the digital still camera, and a timing generation unit 220 that outputs various timing signals to each of the photoelectric conversion apparatus 201 and the signal processing unit 208. In this example, the timing signals may be input from an external device, and the photoelectric conversion system 200 may include at least the photoelectric conversion apparatus 201 and the signal processing unit 208 that processes the output signal output from the photoelectric conversion apparatus 201.

The photoelectric conversion apparatus 201 outputs an image capturing signal to the signal processing unit 208. The signal processing unit 208 performs predetermined signal processing on the image capturing signal output from the photoelectric conversion apparatus 201, and outputs image data. The signal processing unit 208 uses the image capturing signal to generate an image.

The application of the photoelectric conversion apparatuses according to the exemplary embodiments described above makes it possible to realize a photoelectric conversion system capable of stably acquiring a high-quality image with a large saturation signal amount at a high sensitivity.

A sixth exemplary embodiment of the present disclosure will be described. A movable body according to the present exemplary embodiment will be described with reference to FIGS. 14A and 14B.

Figure 14A:
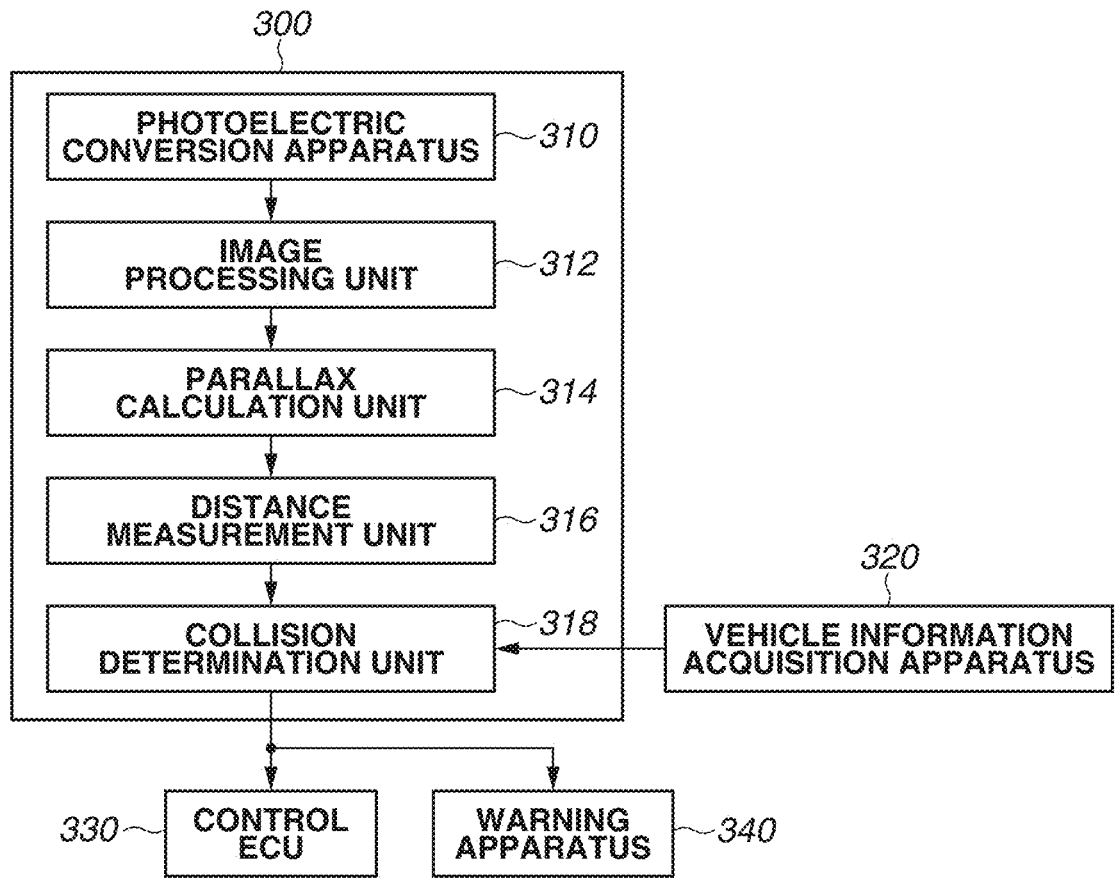
FIGS. 14A and 14B are schematic diagrams each illustrating a movable body according to a sixth exemplary embodiment.

FIG. 14A illustrates an example of a photoelectric conversion apparatus associated with an on-vehicle camera 300. A photoelectric conversion apparatus 310 is any one of the photoelectric conversion apparatuses according to the first to fourth exemplary embodiments described above. The on-vehicle camera 300 includes an image processing unit 312 that performs image processing on a plurality of pieces of image data acquired by the photoelectric conversion apparatus 310, and a parallax calculation unit 314 that calculates parallax information (a phase difference of a parallax image) based on the plurality of pieces of image data acquired by the photoelectric conversion apparatus 310. The on-vehicle camera 300 includes a distance measurement unit 316 that calculates a distance to a target object based on a calculated parallax, and a collision determination unit 318 that determines if a collision may occur based on the calculated distance. Here, each of the parallax calculation unit 314 and the distance measurement unit 316 is an example of a distance information acquisition unit that acquires information about a distance to a target object. Specifically, the distance information is information about a parallax, a defocus amount, a distance to a target object, and the like. The collision determination unit 318 may determine the possibility of occurrence of a collision using any one of the pieces of distance information. The distance information acquisition unit may be implemented by an exclusively designed hardware module, or may be implemented by a software module. Alternatively, the distance information acquisition unit may be implemented by a field programmable gate arrays (FPGA), an application specific integrated circuit (ASIC), and the like, or may be implemented by a combination thereof.

The on-vehicle camera 300 including the photoelectric conversion apparatus 310 is connected to a vehicle information acquisition apparatus 320, and thus can acquire vehicle information, such as a vehicle speed, a yaw rate, or a rudder angle. The on-vehicle camera 300 including the photoelectric conversion apparatus 310 is connected to a control electric control unit (ECU) 330 which is a control device that outputs a control signal for generating a braking force to a vehicle based on a determination result obtained by the collision determination unit 318. The photoelectric conversion apparatus 310 is also connected to a warning apparatus 340 that issues a warning to a driver based on a determination result obtained by the collision determination unit 318. For example, if it is highly likely that a collision will occur as a result of determination by the collision determination unit 318, the control ECU 330 performs a control operation by, for example, applying a brake, pressing back an accelerator, or controlling an engine output, thereby controlling the vehicle to avoid a collision and reduce damage. The warning apparatus 340 issues a warning to a user by, for example, setting off an alarm using sound, displaying warning information on a screen of a car navigation system, or applying a vibration to a seat belt or steering.

Figure 14B:
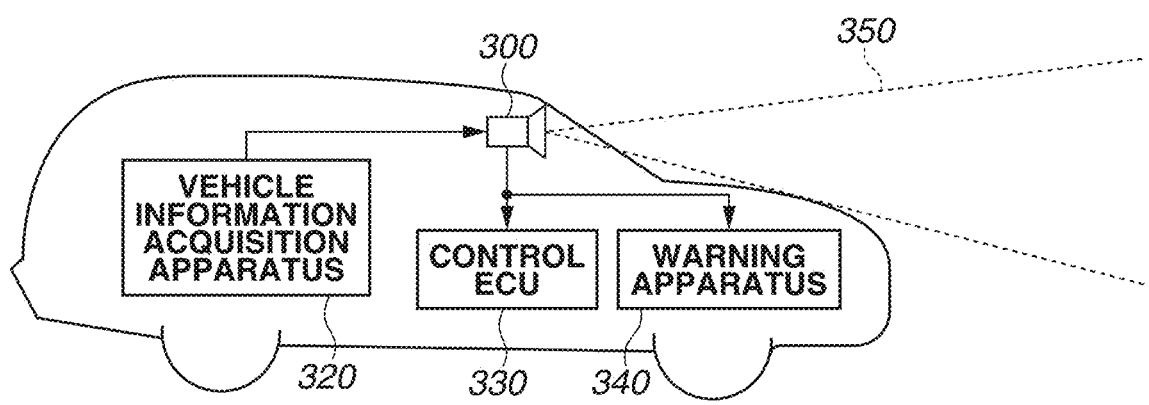

In the present exemplary embodiment, the on-vehicle camera 300 including the photoelectric conversion apparatus 310 captures images of surrounding areas of the vehicle, such as a front area and a rear area. FIG. 14B illustrates the on-vehicle camera 300 when an image of a front side (range 350) of the vehicle is captured. The vehicle information acquisition apparatus 320 sends an instruction to the photoelectric conversion apparatus 310 to perform a predetermined operation. With this configuration, the accuracy of ranging can be improved.

The exemplary embodiments described above illustrate an example in which a control operation is performed to prevent a vehicle from colliding with another vehicle. The present disclosure is also applicable to a control operation for automatic operation to follow another vehicle, a control operation for automatic operation to prevent a vehicle from drifting from a lane, and the like. In addition, the photoelectric conversion apparatus is not limited to a vehicle such as an automobile. For example, the photoelectric conversion apparatus is applicable to moving bodies (moving apparatuses), such as a ship, an aircraft, and an industrial robot can also be applied. In addition, the photoelectric conversion apparatus is not limited to moving bodies and is widely applicable to apparatuses that use object recognition. Examples of the apparatuses include an intelligent transportation system (ITS).

Modified Exemplary Embodiments

The present disclosure is not limited to the exemplary embodiments described above and can be modified in various ways. For example, an example where a part of the configuration according to any one of the exemplary embodiments is added to the configuration according to another exemplary embodiment, and an example where a part of the configuration according to any one of the exemplary embodiments is replaced with a part of the configuration according to another exemplary embodiment are also considered to be exemplary embodiments of the present i disclosure.

The exemplary embodiments described above are merely specific examples for carrying out the present disclosure, and the technical scope of the present disclosure should not be interpreted in a limited manner. That is, the present disclosure can be carried out in various forms without departing from the technical idea or the main features of the disclosure.

According to an aspect of the present disclosure, it is possible to provide a photoelectric conversion apparatus which makes light less likely to be incident on the charge holding portion MEM.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-235921, filed Dec. 17, 2018, which is hereby incorporated by reference herein in its entirety.

What is claimed is:

1. A photoelectric conversion apparatus comprising:
a plurality of pixels each including a photoelectric conversion portion, a charge holding portion disposed in a region not overlapping the photoelectric conversion portion in a planar view and configured to hold a charge generated in the photoelectric conversion portion, a floating diffusion to which the charge is transferred from the charge holding portion, and a first transistor and a second transistor, the first transistor and the second transistor being disposed in a common active region,
wherein the active region includes a partial region as a part of the first transistor and a part of the second transistor,
wherein the partial region includes a first region extending in a first direction in the planar view, a second region connected to the first region and extending in a second direction crossing the first direction in the planar view, and a third region connected to the second region and extending in a third direction opposite to the first direction in the planar view, the third region being a part of the second transistor,
wherein, in the planar view, the partial region of a first pixel among the plurality of pixels is disposed between a gate of the first transistor of the first pixel and the charge holding portion of a second pixel adjacent to the first pixel among the plurality of pixels, and between a gate of the second transistor of the first pixel and the charge holding portion of the second pixel,
wherein the first transistor is a reset transistor,
wherein the second transistor is an amplification transistor, and
wherein a light-shielding member is disposed in a region overlapping the partial region in the planar view.

2. The photoelectric conversion apparatus according to claim 1, further comprising a first contact plug which is connected to the first transistor, and a second contact plug which is connected to the second transistor,
wherein the light-shielding member includes an opening in a region overlapping each of the first contact plug and the second contact plug in the planar view.

3. The photoelectric conversion apparatus according to claim 2,
wherein the photoelectric conversion portion, the charge holding portion, the floating diffusion, a channel of the first transistor, and a channel of the second transistor are included in a semiconductor substrate,
wherein a gate of the first transistor is disposed on a first surface of the semiconductor substrate,
wherein the light-shielding member is disposed on a side of the first surface of the semiconductor substrate, and
wherein a distance from the opening to the charge holding portion of the second pixel in the planar view is at least 15 times greater than a distance from the light-shielding member to the first surface of the semiconductor substrate.

4. The photoelectric conversion apparatus according to claim 2,
wherein the plurality of pixels each includes a selection transistor, and
wherein the opening of the light-shielding member is disposed in a region overlapping a third contact plug which is connected to the selection transistor in the planar view.

5. The photoelectric conversion apparatus according to claim 4, wherein the first contact plug, the second contact plug, and the third contact plug are disposed in a region overlapping the single opening.

6. The photoelectric conversion apparatus according to claim 1, wherein an insulator is disposed between a channel of the first transistor and a channel of the second transistor.

7. The photoelectric conversion apparatus according to claim 1,
wherein the partial region is disposed adjacent to a first side of the charge holding portion of the second pixel, and
wherein the photoelectric conversion portion of the first pixel is disposed adjacent to the first side.

8. The photoelectric conversion apparatus according to claim 1, wherein each of the photoelectric conversion portion, the charge holding portion, and the floating diffusion includes a semiconductor region of a first conductivity type with carriers of a first polarity as majority carriers.

9. A photoelectric conversion apparatus comprising:
a plurality of pixels each including a photoelectric conversion portion, a charge holding portion disposed in a region not overlapping the photoelectric conversion portion in a planar view and configured to hold a charge generated in the photoelectric conversion portion, a floating diffusion to which the charge is transferred from the charge holding portion, and a first transistor and a second transistor, the first transistor and the second transistor being disposed in a common active region,
wherein the active region includes a partial region as a part of the first transistor and a part of the second transistor,
wherein the partial region includes a first region extending in a first direction in the planar view, a second region connected to the first region and extending in a second direction crossing the first direction in the planar view, and a third region connected to the second region and extending in a third direction opposite to the first direction in the planar view, the third region being a part of the second transistor,
wherein, in the planar view, the partial region of a first pixel among the plurality of pixels is disposed between a gate of the first transistor of the first pixel and the charge holding portion of a second pixel adjacent to the first pixel among the plurality of pixels, and between a gate of the second transistor of the first pixel and the charge holding portion of the second pixel,
wherein a light-shielding member is disposed in a region overlapping the partial region in the planar view, and
wherein the light-shielding member is continuous from a light-shielding member disposed in a region overlapping the charge holding portion of the second pixel.

10. The photoelectric conversion apparatus according to claim 9, further comprising a first contact plug which is connected to the first transistor, and a second contact plug which is connected to the second transistor,
wherein the light-shielding member includes an opening in a region overlapping each of the first contact plug and the second contact plug in the planar view.

11. The photoelectric conversion apparatus according to claim 10,
wherein the photoelectric conversion portion, the charge holding portion, the floating diffusion, a channel of the first transistor, and a channel of the second transistor are included in a semiconductor substrate,
wherein a gate of the first transistor is disposed on a first surface of the semiconductor substrate,
wherein the light-shielding member is disposed on a side of the first surface of the semiconductor substrate, and
wherein a distance from the opening to the charge holding portion of the second pixel in the planar view is at least 15 times greater than a distance from the light-shielding member to the first surface of the semiconductor substrate.

12. The photoelectric conversion apparatus according to claim 9,
wherein the partial region is disposed adjacent to a first side of the charge holding portion of the second pixel, and
wherein the photoelectric conversion portion of the first pixel is disposed adjacent to the first side.

13. The photoelectric conversion apparatus according to claim 9, wherein each of the photoelectric conversion portion, the charge holding portion, and the floating diffusion includes a semiconductor region of a first conductivity type with carriers of a first polarity as majority carriers.

14. A photoelectric conversion apparatus comprising:
a plurality of pixels each including a photoelectric conversion portion, a charge holding portion disposed in a region not overlapping the photoelectric conversion portion in a planar view and configured to hold a charge generated in the photoelectric conversion portion, a floating diffusion to which the charge is transferred from the charge holding portion, a first transistor and a second transistor, the first transistor and the second transistor being disposed in a common active region, and a third transistor connected to the floating diffusion and configured to change a capacitance value of the floating diffusion,
wherein the active region includes a partial region as a part of the first transistor and a part of the second transistor,
wherein the partial region includes a first region extending in a first direction in the planar view, a second region connected to the first region and extending in a second direction crossing the first direction in the planar view, and a third region connected to the second region and extending in a third direction opposite to the first direction in the planar view, the third region being a part of the second transistor, wherein, in the planar view, the partial region of a first pixel among the plurality of pixels is disposed between a gate of the first transistor of the first pixel and the charge holding portion of a second pixel adjacent to the first pixel among the plurality of pixels, and between a gate of the second transistor of the first pixel and the charge holding portion of the second pixel, wherein a light-shielding member is disposed in a region overlapping the partial region in the planar view.

15. The photoelectric conversion apparatus according to claim 14, further comprising a first contact plug which is connected to the first transistor, and a second contact plug which is connected to the second transistor, wherein the light-shielding member includes an opening in a region overlapping each of the first contact plug and the second contact plug in the planar view.

16. The photoelectric conversion apparatus according to claim 15, wherein the photoelectric conversion portion, the charge holding portion, the floating diffusion, a channel of the first transistor, and a channel of the second transistor are included in a semiconductor substrate, wherein a gate of the first transistor is disposed on a first surface of the semiconductor substrate, wherein the light-shielding member is disposed on a side of the first surface of the semiconductor substrate, and wherein a distance from the opening to the charge holding portion of the second pixel in the planar view is at least 15 times greater than a distance from the light-shielding member to the first surface of the semiconductor substrate.

17. The photoelectric conversion apparatus according to claim 14, wherein the partial region is disposed adjacent to a first side of the charge holding portion of the second pixel, and wherein the photoelectric conversion portion of the first pixel is disposed adjacent to the first side.

18. The photoelectric conversion apparatus according to claim 14, wherein each of the photoelectric conversion portion, the charge holding portion, and the floating diffusion includes a semiconductor region of a first conductivity type with carriers of a first polarity as majority carriers.

19. A photoelectric conversion system comprising:
a photoelectric conversion apparatus according to claim 1; and
a processing apparatus configured to process a signal from the photoelectric conversion apparatus.

20. A movable body comprising:
a photoelectric conversion apparatus according to claim 1;
a distance information acquisition unit configured to acquire distance information about a distance to a target object from parallax information based on a signal from the photoelectric conversion apparatus; and
a control unit configured to control the movable body based on the distance information.

* * * * *